United States Patent [19]

Spickenreuther

[11] 4,343,875

[45] Aug. 10, 1982

[54] METHOD FOR THE ETCHING OF SILICON SUBSTRATES AND SUBSTRATE FOR THE EXECUTION OF THE METHOD

[75] Inventor: Dieter Spickenreuther, Wettingen, Switzerland

[73] Assignee: BBC Brown, Boveri & Company, Limited, Baden, Switzerland

[21] Appl. No.: 161,447

[22] Filed: Jun. 20, 1980

[30] Foreign Application Priority Data

Jul. 4, 1979 [CH] Switzerland .................. 6230/79

[51] Int. Cl.$^3$ .............. G03F 9/00; H01L 21/312; B44C 1/22; C03C 15/00
[52] U.S. Cl. ........................ 430/5; 156/647; 156/659.1; 156/904; 428/138; 428/428; 430/198; 430/313; 430/330
[58] Field of Search ........... 156/651, 657, 659.1, 156/661.1, 662, 663, 647–649, 667, 904; 65/18, 31, 60 R, 60 D; 428/630–633, 138, 428, 446; 427/93, 279, 193, 372 A, 376 R, 372 B, 376 A, 376 B, 43; 430/4, 5, 198, 311–314, 316, 318, 319, 323, 325, 328–330

[56] References Cited

U.S. PATENT DOCUMENTS

| | | | |
|---|---|---|---|
| 3,575,746 | 4/1971 | Cheskis et al. | 156/659.1 X |
| 3,765,969 | 10/1973 | Kragness et al. | 156/647 |
| 3,888,708 | 6/1975 | Wise et al. | 156/647 |
| 4,040,893 | 8/1977 | Ghezzo | 156/904 X |

FOREIGN PATENT DOCUMENTS

896669 5/1962 United Kingdom .......... 156/662

*Primary Examiner*—William A. Powell
*Attorney, Agent, or Firm*—Oblon, Fisher, Spivak, McClelland & Maier

[57] ABSTRACT

A method of etching a silicon-substrate, wherein a protective layer is formed on the substrate and serves as an etching mask, at least one some areas of the surface of the substrate. A layer of mineral glass, adhering to the substrate, is used for this protective coating. The protective layer can be formed by the application of a mixture containing finely dispersed mineral glass and fixing agents, or a composition which will form mineral glass when heated, to the Si-substrate, by heating the mixture to form a layer of mineral glass adhering to the Si-substrate. If photo-polymerizable components are used in this mixture, the etching mask of glass may be produced by way of photolithography. The invention further includes a Si-substrate provided with a mineral glass protective layer.

32 Claims, 7 Drawing Figures

METHOD FOR THE ETCHING OF SILICON SUBSTRATES AND SUBSTRATE FOR THE EXECUTION OF THE METHOD

BACKGROUND OF THE INVENTION

1. Field of the Invention

This invention relates to the etching of substrates essentially consisting of elementary silicon, or having a surface layer essentially consisting of elementary silicon and which are hereinafter called silicon-substrates, or Si-substrates.

2. Description of the Prior Art

Si-substrates are needed for many purposes of commercial semi-conductor technology and it often becomes necessary that they be etched selectively during their processing. In this connection, etching must be understood quite generally as the removal of predetermined partial areas of the surface of a Si-substrate to a predetermined depth. In particular, etching here must be understood as the chemical treatment of Si-substrates having been provided with etching masks.

Because of the amphoteric properties of silicon, either acid etching means, for instance HF in aqueous solution, or alkaline etching means, for instance anorganic bases, such as KOH, or organic bases such as ethylen-diamine/catechol solutions (also called EDP solutions) may be used.

For the covering of the surface areas of the Si-substrate which are not to be etched, protective layers, or etching masks are used which are either applied to the substrates, as, for instance, masking lacquer or vacuum-vaporized metal coatings, or by local chemical transformation, for instance by oxidation or nitrogenization of the Si-surface. Thereby, the openings in the mask may be created either by selective application of the masking compound onto the areas to be masked, or by selective removal of the masking layer from the areas to be etched at the Si-substrate surface.

The masks for acid, especially for HF-containing etchants usually are formed by masking lacquers, such as photo lacquers on the basis of organic polymers with more or less pronounced acid-resistance but with a low alkali-resistance, especially whenever relatively shallow etchings depths are to be produced; for alkaline etchants, such as concentrated KOH- and EDP- solutions, epitaxially grown silicon-oxide- or silicon-nitride-layers respectively, or vacuum-vaporized metal coatings (for instance, Cr-Au) are utilized for the masking layer.

This means that the utilization of masking lacquers is limited to acid etchants and relatively shallow etching depths. The metal masks which are resistant to alkaline etchants can only be utilized with limitations, since the introduction of foreign metals is usually undesirable in semi-conductor technology, and particularly if processing involving increased temperatures should have to follow the etching process.

Masking layers consisting of epitaxially grown silicon-nitride have the disadvantage that they are relatively hard to etch, particularly if exact etching structures are to be formed; nitride-forming treatment also is expensive. Masking layers consisting of epitaxially grown silicon oxide are attacked by hot alkaline etchants; since the attack of alkaline etchants on $SiO_2$ usually is considerably slower (for instance with hot KOH 1:2000, relative to (100) silicon), than on the Si-substrate, it would be possible to balance the lacking resistance of the protective layer by a correspondingly thick $SiO_2$ layer at the surface of the Si-substrate. This procedure, however, has practical limitations, since the epitaxial growth of a $SiO_2$ layer on the Si-substrate is relatively slow. To give an example, the etching of Si-substrates under the above described conditions (hot KOH, Si(100)) to etching depths of 1000 $\mu$m would require protective layers of epitaxially grown $SiO_2$ with a thickness of at least about 6 $\mu$m. In order to form protective layers of this type, the Si-substrate would have to be heated to 1100°–1200° C. in the oxidizing atmosphere for several hundreds of hours.

It is a known fact (IEEE Transactions on Electron Devices, 25, 1978, pages 1178–1184, and pages 1185–1193) that the etching speed (etching rate, e.g. in $\mu$m etching depth per time unit at a given temperature) depends on the crystallographic structure of the etched Si-layer and that the etching rate decreases in the sequence of $(100) > (110) > (111)$. The above cited example, however, is already based on an optimum condition, so that the so-called anisotropic etching of silicon does not present a method which solves the problem of insufficiently resistent protective layers.

There have been attempts (see literature quoted above) to avoid the relative low resistance of $SiO_2$-protective layers or masks, respectively, by the use of etchants which attack the $SiO_2$-coat to a lesser degree than alkaline metal hydroxide, for instance, on the basis of ethyl-diamine and catechol (also referred to as EDP-solutions), or in some cases by hydrazine, in an aqueous solution. It is a disadvantage in this connection that the silicon-etching rate depends on the doping level of the Si-substrate, and the etching process can take place only in a non-oxidizing atmosphere.

Thus, in summarizing the state of the art of the etching of Si-substrates, it may be said that the problem of the protective coating, especially in the masking area, has not been satisfactorily solved.

SUMMARY OF THE INVENTION

Accordingly, one object of this invention is to provide a novel protective layer which is better suited for the etching of Si-substrates.

This and other objects are achieved according to the invention by making the protective layer on the Si-substrate to be etched, especially in the masking area, out of mineral glass (inorganic glass) having a multitude of extremely finely structured local openings, or "windows".

It is surprising that the process of the invention is suited for the solution of this problem; there was first the prejudice that inorganic glasses, particularly those on silicate basis, were just as vulnerable by anorganic bases as the known epitaxially grown $SiO_2$-layers. It was found, however, that layers of inorganic glasses (in the following called "mineral glasses" to distinguish them from organic glasses) could be applied by relatively easy methods in such thicknesses (for instance up to several micrometers) to the Si-substrates, and with a satisfactory fine structure of the mask-openings, so that a possible etching of the protective layer could, for instance, by a respective thickness of the protective coating, be compensated without any disadvantages.

In addition, the invention provides for a wide variation of the composition of the mineral glass and for an adaptation of the method of the process (etchant, etching temperature, etching depth, substrate-characteristics, mask structure).

Thus, for instance, the alkaline resistance properties of mineral glasses on silicate basis is quite varied and also variable by the selection, or the share, respectively, of the basic components and additives as is well known in the glass making art. Also, not only silicate-glasses but also "glasses" on the basis of other inorganic oxides are known which are also relatively resistant to acid etchants used for Si-substrates.

For many purposes of the invention, the use of silicate-glass for instance, with 40–75% weight $SiO_2$ contents, and of alkaline, anorganic or organic etchants, such as aqueous and/or alcoholic solutions of KOH, NaOH or EDP is preferred, and the known anisotropic etching methods may be applied.

Special examples for mineral glasses are listed below. In general, the term refers to cooled, firm and practically amorphous meltings of inorganic compounds.

In a preferred embodiment of the method of the invention, the etching mask is formed by a layered application of a mixture to the Si-substrate, said mixture containing dispersed (for instance 1–100 $\mu$m particle size) mineral glass or a fuseable mixture forming mineral glass and, preferably, a fixing agent. The protective layer can then be formed on the Si-substrate by melting the mineral glass particles or the glass-forming mixture, respectively, for instance at temperatures of 400°–1100° C. In this connection, it is preferable that the mineral glass be free of components tending to thermic migration into the Si-substrate, as, for instance, Na and, to some extent, also K.

In a particularly preferred embodiment, the fixing agent is a basically known mixture which can photopolymerize by actinic radiation, for instance a technical photo-lacquer or photoresist; this permits the mask structure to be preserved in a particularly simple manner, by an image exposure of a layer, which may consist, for instance, of a mixture of glass powder and photoresist on the Si-substrate, a subsequent "development" (e.g. removal of the non-exposed image areas, with or without fixation of the exposed image areas), and thermic melting of the remaining mask structure to form the covering mineral glass layer adhering to the Si-substrate.

It is understood that the mineral glass layer may also be used to protect the surface of the Si-substrate and that it may be applied there, for this purpose, with a comparatively greater thickness.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
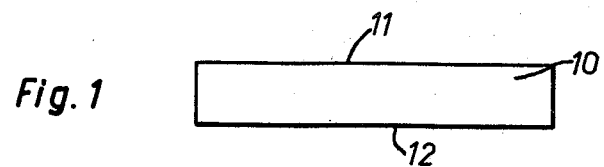
FIGS. 1–7 are sketches illustrating the steps of the method of the invention in a preferred embodiment.

Referring now to the drawings, wherein like reference numerals designate identical or corresponding parts throughout the several views, and more particularly to FIG. 1 thereof, in FIG. 1 there is illustrated a Si-substrate 10, a silicon-disc, as an example, which either consists entirely of Silicon or which has at least one partial layer of Si, forming the upper surface 11. The bottom surface 12 in this example is not supposed to be etched, while etching of both surfaces, i.e. surfaces 11 and 12, is covered by the invention. Should the substrate 10 or its surface 11 to be etched, respectively, be monocrystalline in structure, the surface 11 preferably is located in the (100)-plane.

Figure 2:
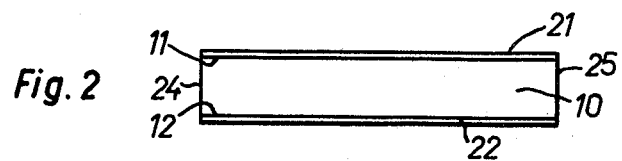

FIG. 2 shows the Si-substrate which, at its both outer surfaces 11, 12, has been provided layers 21, 22. Layers 21, 22 are not necessarily of the same thickness, and the bottom surface layer 22 may, for instance, be considerably thicker than the top surface layer 21. Both layers 21, 22 contain finely dispersed silicate-glass powder and a thermically removable fixing agent (removable, for instance, at temperatures above 400° C.). In the top layer 21, the fixing agent consists at least in part of common photo-lacquer. The bottom layer 22 may contain photo-lacquer, which is the case in the example shown. The lateral surfaces 24, 25 may also be covered by such layers or they may be protected in other ways.

Figure 3:
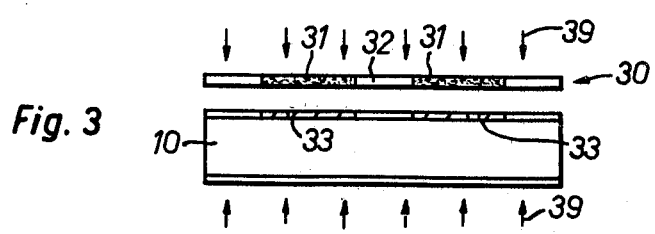

As shown in FIG. 3, a photo-mask 30, having opaque 31 and transparent ares 32, is superimposed on the top layer 21 of the Si-substrate 10. The substrate 10 is then exposed to actinic radiation from both sides, such as, for instance, ultra-violet or daylight, dependent upon the sensitivity of the photo-lacquer. This polymerizes the photo-lacquer in the entire layer 22 and in the areas of the top layer 21 defined by the transparent areas of the photomask 30. In the unexposed areas 33 of the layer 21, the photo-lacquer remains unchanged.

Figure 4:
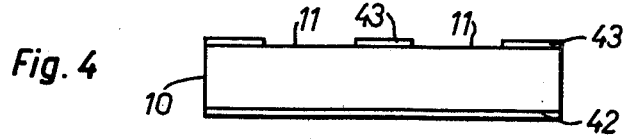

FIG. 4 shows the substrate 10 with a bottom layer 42 made permanent by "developing" or "fixation", respectively, and the remaining masked areas 43 of the fixed top layer 41. By removing the non-exposed areas 33 of FIG. 3, the surface 11 of the substrate is partially bared.

Figure 5:
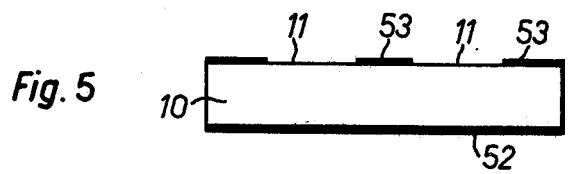

FIG. 5 shows the substrate 10 after heating of the substrate as shown in FIG. 4, bearing the remaining layer areas 42, 43 to temperatures in the range of 400° to 1100° C. in such a manner that layers, or layer areas 52, 53, respectively, of glass are formed by the melting fusion of the glass particles and the removal or disintegration, respectively, of the therein contained shares of fixing agents. Layer 53, for instance, has a thickness of 5–10 $\mu$m; layer 52 is at least as thick as layer 53.

Figure 6:
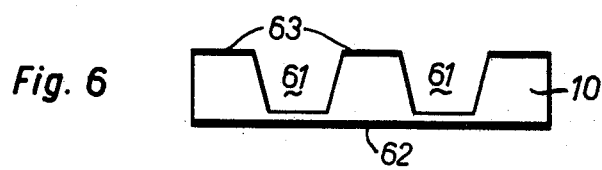
Figure 7:
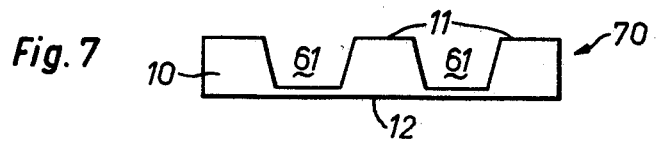

Then the exposed substrate-surface areas 11, as shown in FIG. 5, i.e. the etching windows, are treated with etchants, e.g. aqueous 50% KOH-solution at 80° C., resulting, after about 15 hours, to a shape as shown in FIG. 6, depicting the substrate 10 with etchings 61, 62 (etching depth about 900 $\mu$m) still bearing the remains 62, 63, thinner now from etching, but still effective, of the glass layers 52, 53. The remainders 62, 63 of the etching mask are then removed, for instance by etching with HF, resulting in the ready, etched product 70 from substrate 10, as shown in FIG. 7.

As indicated above, mostly silicate-glasses are preferred for use as mineral glass, which here includes aluminum silicate-, alumoborosilicate-, lead-alumosilicate-, lead silicate-, borosilicate and the like with varying shares of typical glass additives. Particular examples of silicate glasses are combined in Table I. Glasses with other than a silicate-skelton, including practically silicate-free mineral glasses (less than 5% $SiO_2$), such as borate-, aluminoborate-, phosphate- and aluminum phosphate glasses, however, may also be considered, particularly since such mineral glasses under certain conditions may be resistant to HF-containing, non-alkaline etchants, such as special glasses on the basis of $Sb_3O_4/Al_2O_3$/alkali. To mention examples of silicate-glasses, there should be reference to so-called standard glass, apparatus glasses, "thuringia" glass, lead glass, borate glasses, including the brand names such as Pyrex, Schott, Jenaer, Duran, Osram, Corning, Innotech, etc., manufactured by firms of the same name, and others, such as St. Gobain, Schübel, Putzler, Fischer, Gerreshei, Gundelach, Libbey, etc.

dispersion of particle sizes within the aforementioned range can be of advantage, in order to achieve high packing density.

A suitable mixture for the coating of Si-substrates 10 with etching masks or protective layers 21, 22, respectively, may, as an example, be made by producing a suspension of finely powdered glass within a suitable fixing agent and applying it to the Si-substrate by spack-

TABLE I

Technical Silicate Glasses
(Composition In Weight %)

| $SiO_2$ | $B_2O_3$ | PbO | $Al_2O_3$ | ZnO | BaO | CaO | $Na_2O$ | $K_2O$ | MgO | Other (Oxid) | Remarks |
|---|---|---|---|---|---|---|---|---|---|---|---|
| 68 | | | 3.5 | | | 7.5 | 12 | 7.5 | 0.5 | | norm. "Schubal" |
| 53 | 33 | | | | | | | 14 | | | norm. K/Ca/Pb |
| 71 | | | | | | 11 | | 18 | | | norm. K/Ca |
| 78 | | | 0.3 | | | 5 | 7 | 10 | | 0.2 $Fe_2O_3$ | norm. K/Ca |
| 75.5 | | | | | | 11.6 | 12.9 | | | | norm. Na/Ca |
| 77 | | | 0.2 | | | 8 | 12 | 3 | | 0.2 $Fe_2O_3$ | norm. Na/Ca |
| 80.8 | 12 | | 2.3 | | | 0.3 | 4.7 | 0.1 | | 0.2 $Fe_2O_3$ + 0.2 $As_2O_3$ | "PYREX" |
| 67.5–73 | 0.10 | | 2.5–10 | 0–7 | | 0.4–7 | 10–14 | 0–0.2 | | | "JENAER" |
| 65 | 15 | | 3.5 | | 12 | | | | | | Jenaer App. |
| 56 | | 31 | 0.2 | | | | 4 | 9 | | | Bleiglaslead |
| 76 | 16 | | 2 | | | | 5 | 1 | | | "DURAN" |
| 65 | 21 | | 4 | | | | | 9 | 0.5 | | indiff. |
| 67 | 22 | | 2 | | | | −6.5 | — | | | indiff. |
| 42 | | 50 | | | 0.3 | 0.3 | 2 | 4 | | | "R-51" |

The liquefying, or processing temperatures, respectively of mineral glasses suitable for use with this invention range between 400° and 1200° C., for instance between 500° and 1100° C.; hardness on the Mohs-scale typically is between 4 and 8, tensile strength between 3.5 and 8.5, elasticity module between 4000 and 10,000 kg/mm$^2$ and the coefficient of linear head expansion between 35 and 110. Deviations from the just mentioned values are possible, and in addition, the chemical composition must be considered when selecting suitable glasses, with a view of selecting a glass which in general is practically free of elements which could seep into the Si-substrate during the process of the invention and cause undesirable effects, for instance, unwanted doping effects. Thus, for instance, in many applications within semiconductor technology, the uncontrolled seepage of alkalimetals, and Na, K in particular, must be avoided, and in these instances, correspondingly alkalimetal-free mineral glasses, or silicate glasses such as Jenaer apparatus glass (Schott), IP 820 ($SiO_2/PbO/Al_2O_3$) of the firm Innotech, or analogous alkali-free products of other manufacturers should be used. In any case, the selection of suitable mineral-glass compositions for the method of the invention is well within ordinary skill in the art.

As an example, for a preferred group of silicate-glasses we should mention those whose main components are 40–70% weight in $SiO_2$, 0–25% weight $B_2O_3$, 0–50% weight PbO and 0–10% weight $Al_2O_3$ in glass forming shares. The preferred mineral glasses have a sintering or glass-forming area respectively of 400–900 and form a molten mass at temperatures of 600°–1100° C.

The use of finely dispersed (for instance 1–100 μm) glass in layers 21, 22 is preferred, but it is also possible to mix suitably composed glass-forming mixtures of the selected anorganic oxides with fixing agents, or photolacquer, respectively.

In general, the particles made of glass or glass-forming particles, respectively, should have a maximum particle size of $T_g$, which is smaller than or at the most identical to the thickness $D_g$ of layers 21, 22. A broad ling, painting, spraying, spinning or similar methods. Then the fixing agent can be removed, for instance by evaporation or incineration, and the substrate, by heating and melting the glass can be provided with a tightly adhering, continuous, compact protective layer of mineral glass. The desired mask structure can be obtained by common processing photo-lithographically with an etchant containing HF, for the selective removal of the protective glass layer, and then be treated for the purpose of etching the Si-substrate, as described in connection with FIGS. 5 and 6.

A preferred embodiment of the invention is found in fixing agents which may be polymerized ("hardened") by actinic radiation, since, among other reasons, they simplify the creation of the mask structure and certainly the method. Si-substrates having a layer sensitive to actinic radiation, which layer will also form glass when heated, are a particulary preferred embodiment of the invention.

Compounds, or solutions, respectively, which may be polymerized are commonly known in printing (photocomposition) and etching technology, and are obtainable from several manufacturers (for instance, E.I. DuPont de Nemours, BASF, etc.) Photo-lacquers or photoresist materials, respectively, are examples for suitable mixtures.

The method of the invention and the Si-substrate of the invention, respectively, may be utilized in all areas of the production or processing of Si-substrates, which means, particularly in semiconductor technology, the production of Si-diaphragms, and the commercial manufacture of pressure sensitive sensors (see, for instance, K. D. Wise et al, "Diaphragm Formation and Pressure Sensitivity in Batch-Fabricated Silicon Pressure Sensors", University of Michigan, Ann Arbor, USA) must be mentioned as a preferred application. An example described in the following further illustrates the invention, while referring to the description given in connection with FIGS. 1–7: the Si-substrate 10 used was a monocrystalline Si-disc, with a diameter of 25.4 mm and a thickness of 1 mm and a (100)-orientation. (FIG. 1) A mixture was prepared of finely dispersed (5 μm) glass "IP 820" (SiO$_2$/PbO/Al$_2$O$_3$, very pure grade) of the firm of Innotech Glas Products, mixed with technical photo-lacquer "SC photoresist" (Waycoat) to form a still fluid mass, which was applied to the two surfaces 11, 12 of the disc 10 by a conventional spinner, rotating at 4000/rpm. The lateral surfaces of the disc were also covered by this process.

The photo-lacquer-glass-powder layers applied were preset for 15 minutes at 80° C., and then exposed to light in the usual manner, through a mask 30 at the surface layer 21, and freely on all other surfaces and the layers were then developed. By this process, the coating in the areas 33 was removed from the mask windows. The remaining layer 42, 43 and the coating on the surfaces 24, 25 was then set for 20 minutes at 120° C. and then heated in a furnace with access of air to a temperature of 500° C. This combusted the organic components of the layer, so that an adhering, thin, layer of glass-powder, about 5–10 μm thick, remained in the covered areas of substrate 10 which subsequently was melted to glass layers 52, 53 tightly adhering to the areas of the Si-substrate to be covered, by being heated to about 900° C. The substrate 10, thus provided with a protective layer or mask, respectively, was etched for 15 hours in a 50% w. aqueous solution of KOH at a temperature of about 80° C., whereby an etched depth at points 61 of 850–900 μm was obtained, and whereby the protective layers 62, 63, while becoming thinner than the glass layers 52, 53, were still sufficient to protect the substrate 10 from the etchant, which means that despite the considerable etching depth, there was no loss in the masking properties. The etched Si-substrate 70 thus produced was suitable for use as a pressure membrane and perforated carrier plate for pressure sensors.

It is understood that within the framework of this invention, numerous modifications of the mineral glass layers used for the protective coating or etching masks, respectively, are possible for the etching of Si-substrates as described above, so, for instance, the use of different types of glass, fixing agents, etchants, etc.

Obviously, numerous additional modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A method for etching a silicon substrate (Si-substrate), comprising:
   forming a protective layer of mineral glass adhering to the substrate and serving as a mask on at least some portions of said Si-substrate which are not to be etched, said mineral glass protective layer having local openings through which surface areas of the substrate are exposed to an etchant for etching of exposed surface areas;
   etching said substrate after formation of said mineral glass protective layer;
   wherein said mineral glass protective layer forming step comprises:
   applying to the Si-substrate a mixture containing finely dispersed mineral glass particles having a size of about 1–100 μm a component which can be polymerized by actinic radiation and fixing agents, or of a compound which is heat-fusable into mineral glass;
   exposing the applied mixture to actinic radiation to polymerize said applied mixture
   removing portions of said polymerized mixture from those portions of the Si-substrate to be etched;
   heating the non-removed portions of said polymerized mixture for the purpose of forming said etching mask of mineral glass adhering to such Si-substrate.

2. A method according to claim 1, further comprising:
   selecting a mineral glass protective layer substantially free of alkali-metals.

3. A method according to claim 1, further comprising:
   said mineral glass protective layer formed with a layer thickness of 1–100 μm.

4. A method according to claim 2, further comprising:
   said mineral glass protective layer formed with a layer thickness of 1–100 μm.

5. A method according to claim 3, further comprising:
   said layer thickness being 5–20 μm.

6. A method according to claim 4, further comprising:
   said layer thickness being 5–20 μm.

7. A method for etching a silicon substrate (Si-substrate), comprising:
   forming a protective layer of mineral glass having a thickness of 1–100 μm adhering to the substrate serving as a mask on at least some portions of said Si-substrate which are not to be etched, said mineral glass protective layer having local openings through which surface areas of the substrate are exposed to an etchant for etching of exposed surface areas; and
   etching said substrate after formation of said mineral glass protective layer;
   wherein said mineral glass protective layer is formed in varying thicknesses on the surface of said Si-substrate, with at least some of those portions of the surface area covered by relatively thin mineral glass formed in an area neighboring windows through said protective layer.

8. A method according to claim 7, further comprising:
   selecting a mineral glass protective layer substantially free of alkali-metals.

9. A method according to claim 7, wherein said mineral glass protective layer forming step comprises;
   applying to the Si-substrate a mixture containing finely dispersed mineral glass and fixing agents, or of a compound which is heat-fusable into mineral glass; and
   heating said mixture to form a layer of mineral glass adhering to the Si-substrate.

10. A method according to claim 7, wherein said mineral glass protective layer forming step comprises;
    applying to the Si-substrate a mixture containing finely dispersed mineral glass and fixing agents, or of a compound which is heat-fusable into mineral glass; and
    heating said mixture to form a layer of mineral glass adhering to the Si-substrate.

11. A method according to claim 7, further comprising:
    forming said mixture of finely dispersed mineral glass of particles having a sizew of about 1–100 μm and of a component which can be polymerized by actinic radiation;

exposing the applied layer to actinic radiation to polymerize said applied layer;

removing portions of said polymerized layer from those portions of the Si-substrate to be etched;

heating the non-removed portions of said polymerized layer for the purpose of forming said etching mask of mineral glass.

12. A method according to claim 11, further comprising;

forming said mixture of finely dispersed mineral glass of particles having a size of about 1-100 µm and of a component which can be polymerized by actinic radiation;

exposing the applied layer to actinic radiation to polymerize said applied layer;

removing portions of said polymerized layer from those portions of the Si-substrate to be etched;

heating the non-removed portions of said polymerized layer for the purpose of forming said etching mask of mineral glass.

13. A method according to claims 1, 2, 3, 4, 5, 6, 7, 8, 9, 10, 11 or 12, further comprising:

said layer thickness being 5-20 µm.

14. A method of etching a silicon substrate for removing a silicon portion from said substrate, said method comprising the steps of:

forming a temporary masking layer on at least one silicon surface of said substrate, said masking layer having a predetermined pattern comprising at least one opening for defining an exposed area of said silicon surface and at least one protecting layer portion where said masking layer adheres to and covers a portion of said silicon surface for defining a non-exposed area thereof;

contacting said exposed area with a chemical etchant for removing said silicon portion from said substrate; and removing said temporary masking layer from said non-exposed area of said silicon surface;

wherein said forming step further comprises:

forming said temporary masking layer by providing on said surface and in said pattern a composition capable of forming upon heating a layer of a mineral glass adhering to said silicon surface; and heating said layer of said composition to convert said layer of said composition into a layer of mineral glass having said pattern prior to said contacting of said exposed area with said chemical etchant.

15. The method of claim 14, wherein said temporary masking layer is formed with a thickness between 1-100 µm.

16. The method of claim 14 wherein said composition comprises a particulate mineral constituent selected from the group consisting of preformed glass and metal oxides capable of forming a glass upon heating.

17. The method of claim 15 wherein said composition comprises a fixing agent.

18. The method of claim 15 wherein said particulate mineral constituent is selected from the group consisting of preformed silicate glass and metal oxides capable of forming a silicate glass upon heating.

19. The method of claim 15 wherein said particulate mineral constituent is substantially free of alkali metals.

20. The method of claim 16 wherein said fixing agent is capable of being polymerized by actinic radiation.

21. A method according to claims 14, 15, 16, 17, 18, 19 or 20 further comprising:

said mineral glass protective layer formed with a layer thickness of 1-100 µm.

22. A method according to claim 21, further comprising:

said layer thickness being 5-20 µm.

23. The method of claim 19 wherein said temporary masking layer is formed by applying a layer of said composition to cover said exposed and said non-exposed areas of said silicon surface; exposing said layer in said non-exposed areas to actinic radiation for polymerizing said fixing agent in said non-exposed areas, and heating said layer in said non-exposed areas for said conversion into said layer of mineral glass having said pattern.

24. Application of the method as claimed in claim 14, for the manufacture of pressure sensors containing a silicon-substrate, having etched areas.

25. A method according to claim 14, further comprising:

selecting an etchant comprising a solution containing an organic base.

26. A method according to claim 25, comprising:

selecting an etchant comprising KOH as said anorganic base.

27. A method according to claim 25, comprising:

selecting an etchant comprising NaOH as said anorganic base.

28. A method according to claim 14, further comprising:

selecting an etchant comprising a solution containing an organic base.

29. A method according to claim 28, further comprising:

selecting an etchant comprising ethyldiamine as said organic base.

30. A method according to claim 28, further comprising:

selecting an etchant comprising catechol as said organic base.

31. A silicon-substrate (Si-substrate) provided with an etching mask to cover selected surface areas of the Si-substrate not to be etched, comprising:

said etching mask at least partially consisting of a mixture suitable for the formation of a layer of mineral glass adhering to the Si-substrate;

said substrate at least over parts of its surface area being covered by a layer consisting of a mixture containing finely dispersed mineral glass and a component which is polymerizable by actinic radiation.

32. A substrate according to claim 31, wherein said polymerizable component comprises:

a photo-lacquer.

* * * * *